US008665566B1

(12) United States Patent
Pan et al.

(10) Patent No.: US 8,665,566 B1
(45) Date of Patent: Mar. 4, 2014

(54) SUSPENSION TAIL DESIGN FOR A HEAD GIMBAL ASSEMBLY OF A HARD DISK DRIVE (75) Inventors: Tzong-Shii Pan, San Jose, CA (US); Yih-Jen D. Chen, Fremont, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 105 days.

(21) Appl. No.: 13/331,313

(22) Filed: Dec. 20, 2011

(51) Int. Cl.
G11B 5/48 (2006.01)

(52) U.S. Cl.
USPC ..................................... 360/264.2

(58) Field of Classification Search
USPC .......... 360/264.2, 265.9, 294.4, 254.1, 245.9, 360/265, 245.8, 265.7
See application file for complete search history.

(56) References Cited

U.S. PATENT DOCUMENTS

| | | | |
|---|---|---|---|
| 5,465,186 A | 11/1995 | Bajorek et al. | |
| 5,861,661 A | 1/1999 | Tang et al. | |
| 5,903,056 A | 5/1999 | Canning et al. | |
| 6,036,813 A | 3/2000 | Schulz et al. | |
| 6,076,256 A * | 6/2000 | Drake et al. | 29/825 |
| 6,228,689 B1 | 5/2001 | Liu | |
| 6,351,352 B1 | 2/2002 | Khan et al. | |
| 6,381,099 B1 | 4/2002 | Mei | |
| 6,382,499 B1 | 5/2002 | Satoh et al. | |
| 6,614,623 B2 | 9/2003 | Nakamura et al. | |
| 6,639,757 B2 | 10/2003 | Morley et al. | |
| 6,656,772 B2 | 12/2003 | Huang | |
| 6,703,566 B1 | 3/2004 | Shiraishi et al. | |
| 6,757,137 B1 | 6/2004 | Mei | |
| 6,992,862 B2 | 1/2006 | Childers et al. | |
| 7,075,701 B2 | 7/2006 | Novotny et al. | |
| 7,154,708 B2 | 12/2006 | Chhabra et al. | |
| 7,205,484 B2 | 4/2007 | Shiraishi et al. | |
| 7,245,458 B2 | 7/2007 | Zhang et al. | |
| 7,298,593 B2 | 11/2007 | Yao et al. | |
| 7,359,154 B2 | 4/2008 | Yao et al. | |
| 7,372,669 B2 | 5/2008 | Deguchi et al. | |
| 7,375,874 B1 | 5/2008 | Novotny et al. | |
| 7,388,733 B2 | 6/2008 | Swanson et al. | |
| 7,394,139 B2 | 7/2008 | Park et al. | |
| 7,414,814 B1 | 8/2008 | Pan | |
| 7,440,236 B1 | 10/2008 | Bennin et al. | |
| 7,450,346 B2 | 11/2008 | Arya et al. | |
| 7,515,240 B2 | 4/2009 | Lu et al. | |
| 7,525,769 B2 | 4/2009 | Yao et al. | |
| 7,652,890 B2 | 1/2010 | Ohsawa et al. | |
| 7,697,102 B2 | 4/2010 | Hirakata et al. | |
| 7,764,467 B2 | 7/2010 | Hanya et al. | |
| 7,876,664 B2 | 1/2011 | Tsukagoshi et al. | |
| 8,015,692 B1 | 9/2011 | Zhang et al. | |
| 8,030,576 B2 | 10/2011 | Kamei et al. | |
| 8,111,483 B2 | 2/2012 | Arai | |

(Continued)

OTHER PUBLICATIONS

US 7,337,529, 03/2008, Bennin et al. (withdrawn)

Primary Examiner — Allen T Cao (57) ABSTRACT

A method of assembling a head stack assembly of a magnetic storage drive is provided. The method includes attaching a flexible printed circuit (FPC) with a suspension tail of a head gimbal assembly, wherein the suspension tail includes a plurality of discrete segments positioned within a bonding area and other portions of a structural layer outside of the bonding area, and pressing tail bond pads of the suspension tail against corresponding ones of FPC bond pads of the FPC by bringing a single flat surface of a thermode in contact with each of the discrete segments.

11 Claims, 7 Drawing Sheets

(56) References Cited

U.S. PATENT DOCUMENTS

| | | | |
|---|---|---|---|
| 8,295,013 B1 * | 10/2012 | Pan et al. | 360/245.4 |
| 8,295,014 B1 * | 10/2012 | Teo et al. | 360/245.9 |
| 8,320,084 B1 * | 11/2012 | Shum et al. | 360/245.9 |
| 8,325,446 B1 * | 12/2012 | Liu et al. | 360/245.9 |
| 8,325,447 B1 * | 12/2012 | Pan | 360/245.9 |
| 8,467,153 B1 | 6/2013 | Pan et al. | |
| 8,477,459 B1 * | 7/2013 | Pan | 360/245.9 |
| 2001/0017749 A1 | 8/2001 | Stefansky | |
| 2005/0030670 A1 | 2/2005 | Ando et al. | |
| 2005/0243472 A1 | 11/2005 | Kamigama et al. | |
| 2006/0098347 A1 | 5/2006 | Yao et al. | |
| 2006/0146262 A1 | 7/2006 | Yu et al. | |
| 2006/0157869 A1 | 7/2006 | Huang et al. | |
| 2007/0246251 A1 | 10/2007 | Shiraishi et al. | |
| 2008/0002303 A1 | 1/2008 | Wang et al. | |
| 2008/0068757 A1 | 3/2008 | Kamigama et al. | |
| 2008/0088975 A1 | 4/2008 | Bennin et al. | |
| 2008/0225439 A1 | 9/2008 | Komura | |
| 2009/0151994 A1 | 6/2009 | Ohsawa et al. | |
| 2009/0211789 A1 | 8/2009 | Yeates et al. | |
| 2009/0253233 A1 | 10/2009 | Chang et al. | |
| 2010/0118444 A1 | 5/2010 | Rothenberg et al. | |
| 2010/0176827 A1 | 7/2010 | Yamazaki et al. | |
| 2010/0188778 A1 | 7/2010 | Castagna | |
| 2010/0195474 A1 | 8/2010 | Tsukuda et al. | |
| 2011/0317309 A1 | 12/2011 | Shum et al. | |
| 2012/0067626 A1 | 3/2012 | Mizutani | |

* cited by examiner

SUSPENSION TAIL DESIGN FOR A HEAD GIMBAL ASSEMBLY OF A HARD DISK DRIVE

FIELD

Aspects of the present invention are directed toward a flexure of a head-gimbal assembly of a hard disk drive and, more particularly to a design of a flexure tail that facilitates bonding between the flexure and a flexible printed circuit.

BACKGROUND

Information storage devices are used to retrieve and/or store data in computers and other consumer electronics devices. A magnetic hard disk drive is an example of an information storage device that includes one or more heads that can both read and write from one or more rotating storage media. In a magnetic hard disk drive device, each head is a sub-component of a head-gimbal assembly (HGA) that typically includes a laminated flexure to carry electrical signals to and from the head. The HGA, in turn, is a sub-component of a head-stack assembly (HSA) that typically includes one or more HGAs, an actuator, and a flexible printed circuit (FPC). The one or more HGAs are attached to various arms of the actuator.

Each of the laminated flexures typically includes electrically conductive traces (e.g., copper traces) that are isolated from a stainless steel structural layer by a dielectric layer such as a polyimide layer, and the conductive traces transfer signals between the head and the FPC on the actuator body. Each HGA flexure includes a flexure tail that is attached to the FPC adjacent the actuator body. That is, the conductive traces extend from adjacent the head and continue along the flexure to electrical connection points (or pads) located at the tail portion of the flexure. The FPC includes conductive electrical terminals (or bond pads) that correspond to the electrical connection points of the flexure tail.

To facilitate electrical connection of the conductive traces of the flexure tails to the conductive electrical terminals of the FPC during an HSA manufacturing process, the flexure tails are first properly positioned relative to the FPC so that the connection points of the flexure tails are aligned with the conductive electrical terminals of the FPC. Then, the flexure tails are held or constrained against the conductive electrical terminals of the FPC while the electrical connections are made (e.g., by ultrasonic bonding, solder jet bonding, solder bump reflow, or anisotropic conductive film bonding).

An anisotropic conductive film (ACF) is an adhesive doped with conductive beads or cylindrical particles of uniform or similar diameter. As the doped adhesive is compressed and cured, it is squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

In a high-volume manufacturing environment like the very competitive information storage device industry, there is a practical need for a fast and cost-effective method of bonding many bond pads simultaneously. In particular, there is a need in the art for an improved flexure design that may facilitate the bonding of many bond pads simultaneously or concurrently.

SUMMARY

Aspects of embodiments according to the present invention are directed toward an improved flexure of a head gimbal assembly, a disk drive including the same, and methods for manufacturing the same. In one embodiment, a suspension assembly of a head gimbal assembly for a disk drive includes a dielectric layer, a conductive layer, and a structural layer. The dielectric layer has a first side and a second side opposite the first side. The conductive layer is on the first side of the dielectric layer, and includes a plurality of bond pads at a tail portion of the suspension assembly. The structural layer is on the second side of the dielectric layer, and the structural layer consists of a plurality of discrete segments positioned within a bonding area and other portions positioned outside of the bonding area. The plurality of discrete segments respectively correspond in position to the bond pads. The bonding area extends beyond an area including the plurality of discrete segments by a preselected amount, and the preselected amount is selected such that the plurality of discrete segments are configured to receive a single flat surface without contacting the other portions of the structural layer.

In some embodiments, the suspension assembly may further include a cover layer on the conductive layer, and the cover layer may have a plurality of openings at locations corresponding to the bond pads. The dielectric layer may have a plurality of openings respectively corresponding to spaces adjacent to the bond pads. The dielectric layer may include polyimide. The conductive layer may include a plurality of electrically conductive traces connected between the bond pads and a head of the suspension assembly. The structural layer may include a stainless steel layer.

In another embodiment, a method of assembling a head stack assembly of a disk drive including a flexible printed circuit (FPC) and a head gimbal assembly is provided. The method includes applying an adhesive material on a component selected from the group consisting of a plurality of tail bond pads of a suspension tail of the head gimbal assembly and a plurality of FPC bond pads of the FPC, and attaching the FPC with the suspension tail, wherein the suspension tail includes a dielectric layer, the plurality of tail bond pads on a first side of the dielectric layer, and a structural layer on a second side of the dielectric layer, the structural layer consisting of a plurality of discrete segments positioned within a bonding area and other portions positioned outside of the bonding area, the plurality of discrete segments respectively corresponding in position to the tail bond pads. The method further includes aligning the plurality of tail bond pads with the plurality of FPC bond pads on the FPC, providing a flat surface against the FPC, and pressing the tail bond pads against corresponding ones of the FPC bond pads by bringing a single flat surface of a thermode in contact with each of the discrete segments and without contacting the other portions of the structural layer.

The FPC may include a cover layer on a side thereof facing toward the suspension tail, and the cover layer may have an opening corresponding to the bonding area. The cover layer of the FPC and the single flat surface of the thermode may not overlap with each other. The adhesive material may include an anisotropic conductive film (ACF). The dielectric layer may have a plurality of openings at respective locations adjacent to the tail bond pads.

The pressing the tail bond pads against corresponding ones of the FPC bond pads may include transferring heat from the thermode through the discrete segments in the bonding area to the tail bond pads to raise the temperature of the ACF to a preselected temperature.

The method may further include removing an elongated structural member from the suspension tail, the elongated structural member having a first end and a second end respectively connected to the other portions of the structural layer located outside of the bonding area of the suspension tail.

In another embodiment, a disk drive includes a disk drive base, a disk rotatably mounted to the disk drive base, an actuator rotatably mounted to the disk drive base, the actuator including a flexible printed circuit (FPC) having a plurality of FPC bond pads, and at least one head gimbal assembly as described above operatively attached to the actuator.

DETAILED DESCRIPTION

Figure 1:
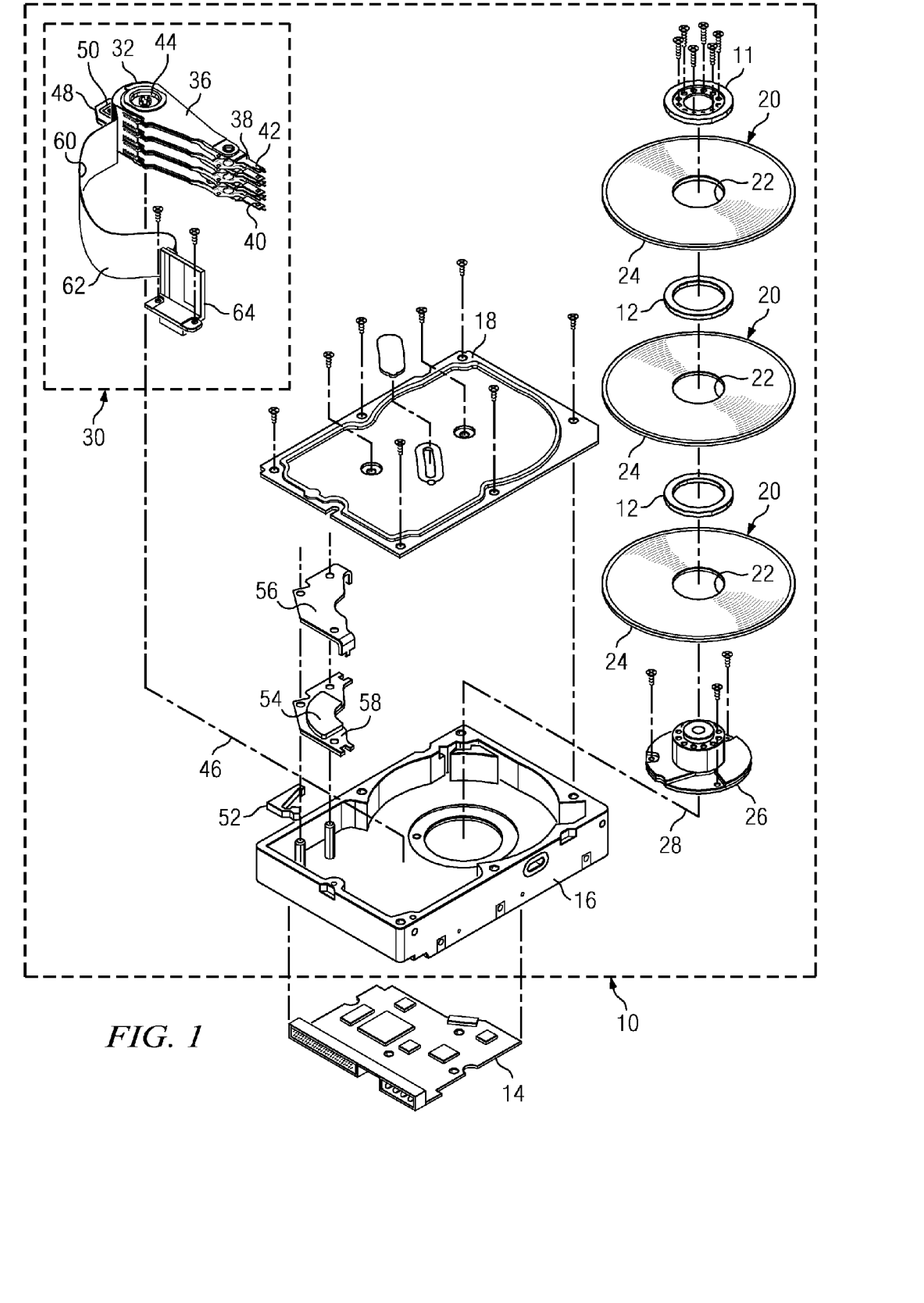
FIG. 1 is an exploded perspective view of a disk drive including improved flexure tails for bonding according to an embodiment of the present invention.

FIG. 1 is an exploded perspective view of a disk drive according to an embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a number of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The HDA 10 further includes a spindle motor 26 for rotating the disk 20 about a disk axis of rotation 28. The spindle motor 26 includes a spindle motor hub that is rotatably attached to the base 16 of the HDA 10. The disks 20 may be stacked and separated with one or more annular disk spacers 12 that are disposed about the hub, all held fixed to the hub by a disk clamp 11.

The HDA 10 further includes a head stack assembly (HSA) 30 rotatably attached to the base 16 of the HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to the HDA 10 about an actuator pivot axis 46. One or two head gimbal assemblies (HGA) 38 are attached to a distal end of each actuator arm 36. Each HGA includes a head (e.g., head 40) for reading and writing data from and to the disk 20, and a load beam 42 to compliantly preload the head against the disk 20. The HSA 30 further includes a coil support 48 that extends from one side of the HSA 30 that is opposite the head 40. The coil support 48 is configured to support a coil 50 through which a changing electrical current is passed. The coil 50 interacts with one or more magnets 54 that are attached to the base 16 via a yoke structure 56, 58 to form a voice coil motor for controllably rotating the HSA 30. The HDA 10 also includes a latch 52 rotatably mounted on the base 16 to prevent undesired rotations of the HSA 30.

The PCBA 14 includes a servo control system for generating servo control signals to control the current through the coil 50 and thereby position the HSA 30 relative to tracks disposed upon surfaces of the disks 20. The HSA 30 is electrically connected to the PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible in FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40 and a surface of the magnetic disk 20. The thickness of the air bearing at the location of the transducer is commonly referred to as "flying height."

Figure 2:
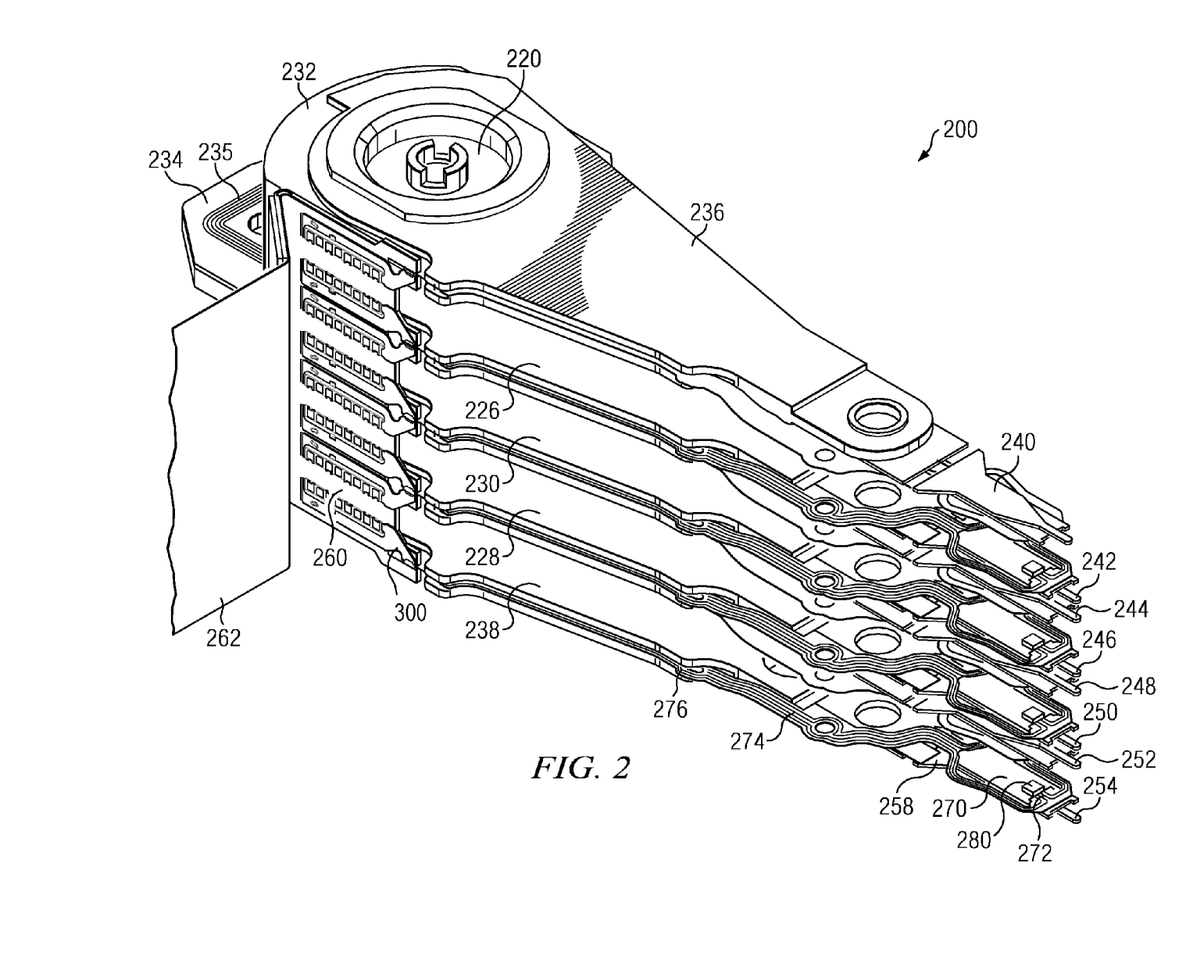
FIG. 2 is a perspective view of a head stack assembly (HSA) including improved flexure tails for bonding according to an embodiment of the present invention.

FIG. 2 is a perspective view of a head stack assembly (HSA) 200 according to an embodiment of the present invention. The HSA 200 includes an actuator body 232 and a number of actuator arms 226, 228, 230, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 228, 230, 236, 238. The HSA 200 also includes a number of head gimbal assemblies (HGA) 240, 242, 244, 246, 248, 250, 252, 254, attached to the actuator arms 226, 228, 230, 236, 238. For example, such attachment may be made by swaging. Each of the inner actuator arms 226, 228, 230 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g., HGA 254 includes head 280). The head 280 is attached to a tongue portion 272 of a laminated flexure 270. The laminated flexure 270 is part of the HGA 254 and is attached to a load beam 258 (another part of the HGA 254). The laminated flexure 270 may include a structural layer (e.g., a stainless steel layer), a dielectric layer (e.g., a polyimide layer), and a conductive layer (e.g., a copper layer) into which traces are patterned. The HSA 200 also includes a flexible printed circuit (FPC) 260 adjacent the actuator body 232, and the FPC 260 includes a flex cable 262. The FPC 260 may include a laminate that includes two or more conventional dielectric and conductive layer materials (e.g., one or more polymeric materials, copper, etc). The laminated flexure 270 includes a terminal region (or flexure tail) 300 that is electrically connected to connection points (e.g., bond pads) of the FPC 260.

Methods of electrical connection of the flexure tails to the FPC 260 include solder reflow, solder jet bonding (SJB), ultrasonic pad bonding (USPB) and anisotropic conductive film (ACF) bonding. To electrically connect and securely attach the flexure tails to the FPC 260, the flexure tails are first aligned with the FPC 260, and then pressed against the FPC 260 (at least temporarily) while electrical connection is established and secure attachment is completed, for example, by ACF bonding.

Embodiments of the present invention relate to a suspension tail of a flexure (i.e., flexure tail) of a HGA including bond pad designs for more effective and reliable ACF bonding, and methods for bonding the flexure tail with a FPC. According to the embodiments, isolated or discrete structural segments, e.g., stainless steel (SST) pads, are located in an ACF bonding area on a support side (e.g., the structural layer) of a dielectric layer, and other structural elements (e.g., SST frame or patch) are located outside of the bonding area. A number of bond pads (e.g., copper pads) are located on a side of the dielectric layer opposite the support side. Each of the discrete structural segments supports a corresponding one of the bond pads in the bonding area. Because the bonding area is clear of structural elements other than the discrete structure segments, a single flat surface of a thermode can be used to apply pressure and heat to all of the discrete structure segments for simultaneous bonding, hence greatly reducing the process complexity. In addition, no cover layer is required in a corresponding bonding area of the FPC, and therefore the distance or gap between the bond pads on the FPC and the bond pads on the flexure tail can be reduced.

Figure 3A:
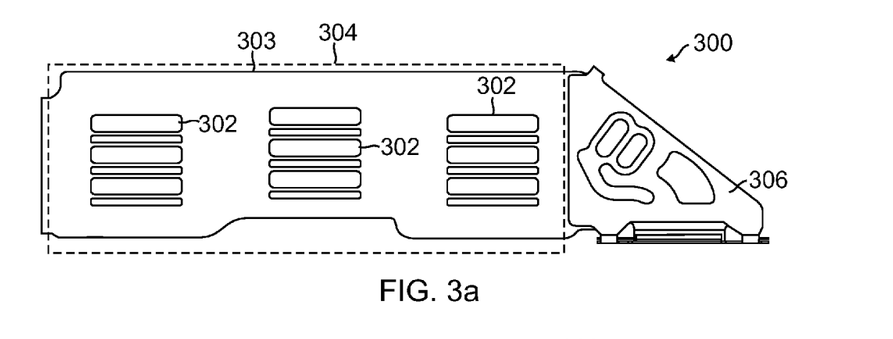
FIGS. 3(a)-3(c) illustrate a tail portion of an improved flexure of a head gimbal assembly (HGA) according to an embodiment of the present invention.
Figure 3B:
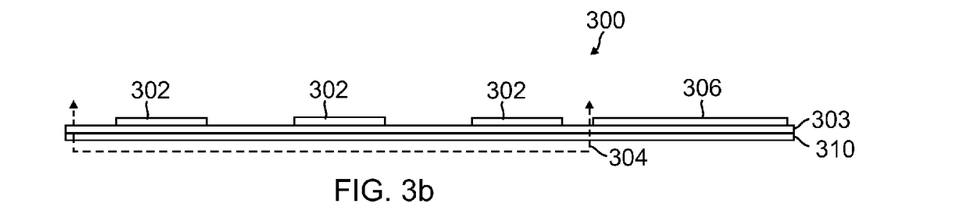
Figure 3C:
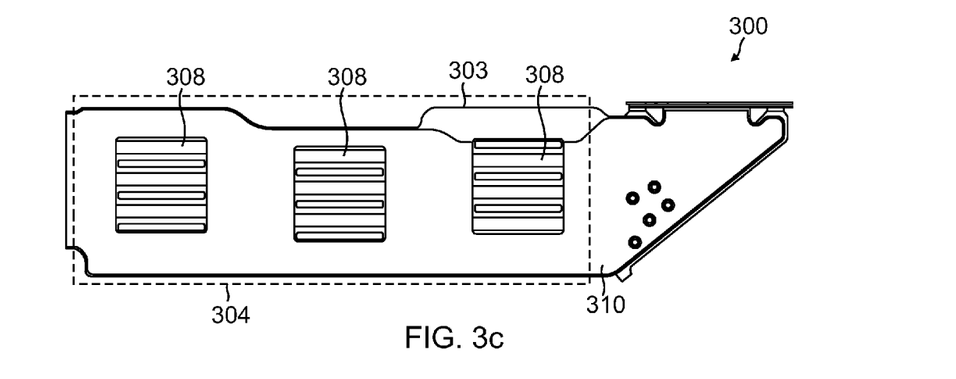

FIGS. 3(a)-3(c) illustrate the flexure tail 300 (hereafter "suspension tail") in a support layer plan view FIG. 3(a), a side view FIG. 3(b), and a signal layer (e.g., the conductive layer) plan view FIG. 3(c), according to an embodiment of the present invention. Referring to the support layer plan view of FIG. 3(a), a number of discrete segments 302 (e.g., stainless steel pads) are positioned on a dielectric layer 303 (e.g., a polyimide layer) in a bonding area 304 in which no other structural support element is present. The bonding area 304 extends beyond an area including only the plurality of discrete segments 302 by a preselected amount. For example, a support member 306 is located outside of the bonding area 304 and is not connected to the discrete segments 302.

Referring to the side view of FIG. 3(b), it can be seen that the discrete segments 302 are the tallest features in the bonding area 304. Therefore, a single flat surface of a thermode or other suitable devices can be used to apply pressure and heat to all of the discrete segments 302 at the same time to improve the ACF bonding process efficiency and its long term reliability. Referring to the signal layer plan view of FIG. 3(c), a number of bond pads 308 are located in the bonding area 304 on the dielectric layer 303. The bond pads 308 may be copper bond pads plated with gold or made of other electrically conductive materials suitable for ACF bonding. The bond pads 308 are electrically connected with conductive traces (not visible in FIG. 3 but see FIG. 4) that are covered by a cover layer 310 to avoid undesirable shorting. The suspension tail shown in FIG. 3 is to be attached to a FPC, and the bond pads 308 are each aligned with a corresponding bond pad on the FPC during an ACF bonding process.

During the ACF bonding process, the single flat surface of the thermode (not shown in FIG. 3) is configured to contact only the discrete segments 302 (e.g., isolated SST patch) that respectively support the bond pads 308 on the signal layer side. Pressure and heat applied by the thermode will pass through the discrete segments 302, the dielectric layer 303, and the bond pads 308 to the ACF bonding material located between the bond pads 308 and the bond pads of the FPC. The cover layer 310 on the suspension tail 300 has openings corresponding to the bond pads 308. Therefore, the gap between the bond pads 308 and the bond pads of the FPC is reduced to the desired distance, and the adhesive of the ACF bonding material is cured to make a reliable joint between the suspension tail 300 and the FPC.

Figure 4:
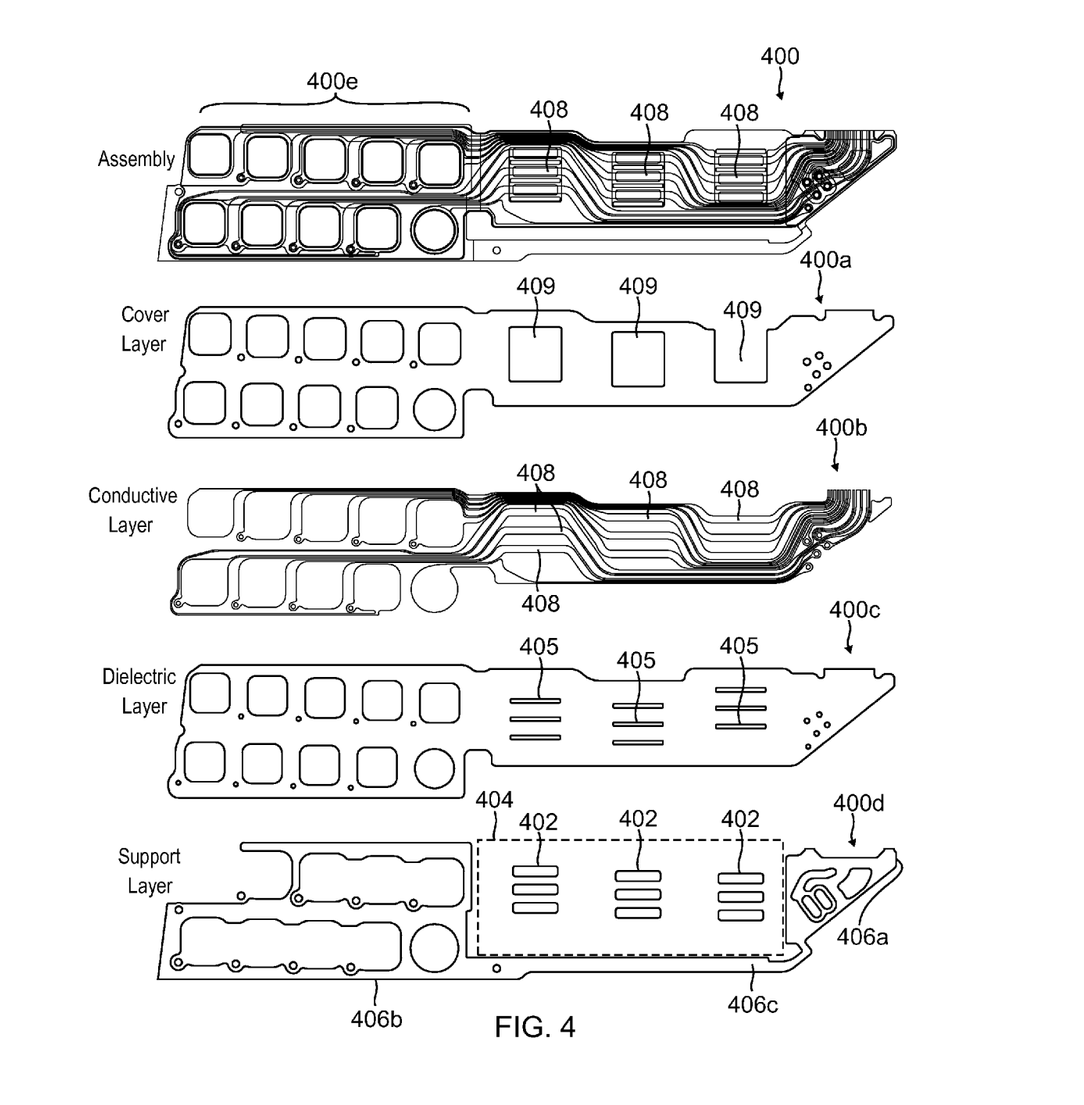
FIG. 4 illustrates a suspension tail of an improved flexure and each layer thereof according to an embodiment of the present invention.
Figure 5:
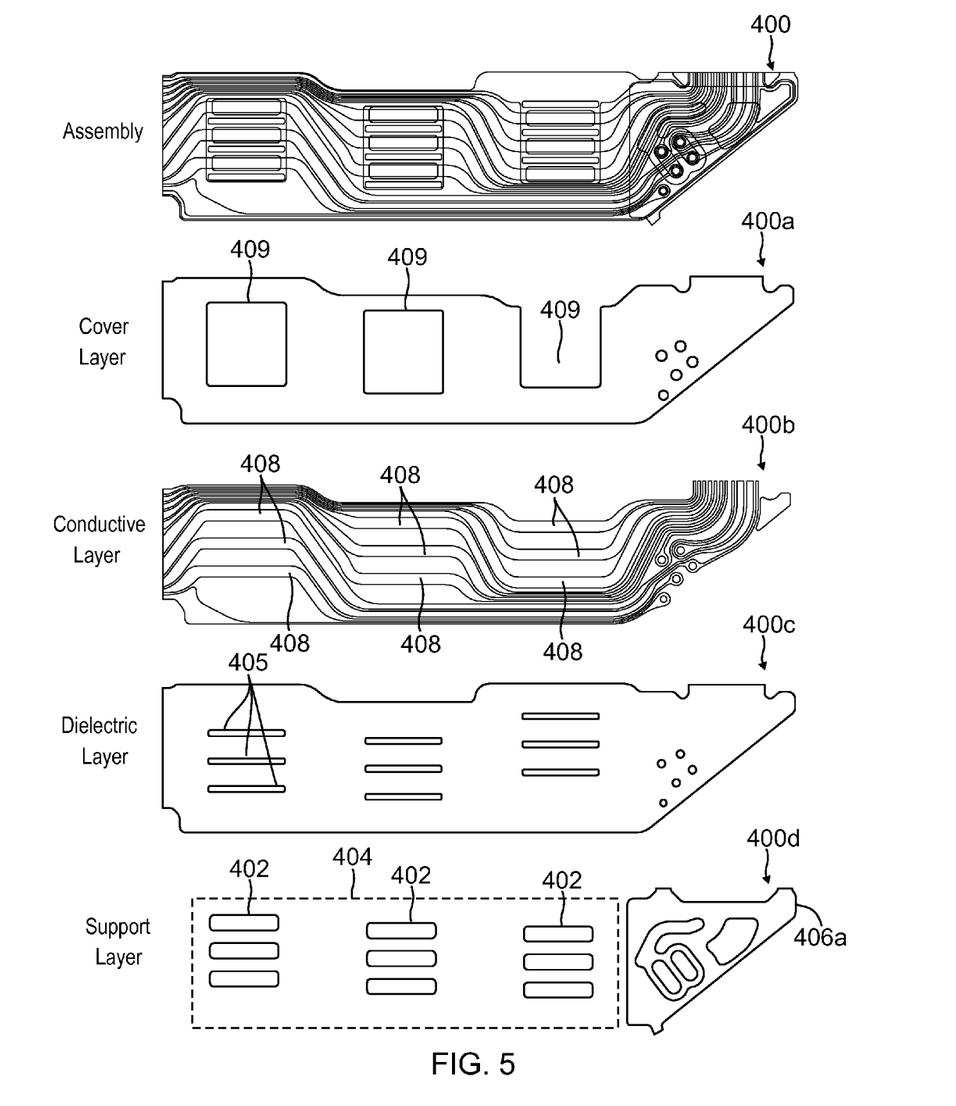
FIG. 5 illustrates the suspension tail of FIG. 4 with a test terminal section removed.

FIG. 4 is a top view of a suspension tail 400 and each of four layers of the suspension tail 400 in more detail according to an embodiment of the present invention. In FIG. 4, the suspension tail 400 has a cover layer 400a, a copper trace layer (e.g., conductive layer) 400b covered by the cover layer 400a, a dielectric layer 400c on which the copper trace layer 400b is formed, and a structural support layer 400d under the dielectric layer 400c. That is, the various layers of the suspension tail 400 are arranged in the following order: the cover layer 400a, the copper trace layer 400b, the dielectric layer 400c, and the structural support layer 400d. The suspension tail 400 has a test terminal section 400e having a number of test points to facilitate testing during manufacturing, and the test terminal section 400e may be removed after assembly. FIG. 5 is a schematic drawing illustrating the suspension tail 400 with the test terminal section 400e removed.

Referring to FIGS. 4 and 5, the copper trace layer 400b is positioned on a first side of the dielectric layer 400c. The copper trace layer 400b include a number of traces for transferring electrical signals. Portions of the traces are widened to form a number of bond pads 408 at preselected locations. For example, nine bond pads 408 arranged in three columns are formed by the widened portions of the traces, and each column includes three bond pads 408. Here, the bond pads 408 have a substantially rectangular shape. However, the present invention is not limited thereto, and the bond pads 408 may have other shapes suitable for ACF bonding. In addition, the bond pads 408 are typically plated with gold for ACF bonding.

The copper trace layer 400b is covered by the cover layer 400a which may be formed of a polyimide (PI) layer. The cover layer 400a has a number of open areas or openings 409 in a bonding area that expose the bond pads 408 to be bonded with a flexible printed circuit (FPC) during assembly. In the embodiment of FIGS. 4 and 5, the cover layer 400a has three open areas 409 respectively corresponding in position to the three columns of bond pads 408 of the copper trace layer 400b. For the FPC, there may be no cover layer in the bonding area according to one embodiment of the present invention.

The dielectric layer 400c is positioned between the copper trace layer 400b and the structural support layer 400d, and may be made of a PI layer. The dielectric layer 400c has a number of openings 405 that are positioned adjacent to and/or between corresponding bond pads 408. The structural support layer 400d may be made of stainless steel or other suitable structural materials. A number of discrete segments 402 (e.g., stainless steel pads) of the structural support layer 400d are positioned in a bonding area 404 to support the bond pads 408. Within the bonding area 404, no other structural elements are present besides the discrete segments 402. That is, the bonding area 404 extends beyond an area including only the discrete segments 402 by a preselected amount. Because the discrete segments 402 each correspond to the bond pads 408 in position, the openings 405 of the dielectric layer 400c are respectively positioned adjacent to and/or between corresponding ones of the discrete segments 402. Therefore, the openings 405 may allow some of the ACF bonding material between the suspension tail 400 and the FPC to escape through it during ACF bonding.

Referring now to FIG. 5, the test terminal section 400e (see FIG. 4) has been removed, and the structural support layer 400d includes no support elements (e.g., stainless steel frame) in the bonding area 404 of the suspension tail 400 except the discrete segments 402. That is, the discrete segments 402 are isolated from other support elements. For example, a first support element 406a is not connected to any of the discrete segments 402.

Referring back to FIG. 4, the first support element 406a is connected to a second support element 406b via a third support element 406c (e.g., an external strut). The third support element 406c is optional, but the third support element 406c may be included to address a potential suspension tail distortion problem (i.e., flexing of the suspension tail 300) during an HGA assembly process. The presence of the third support element 406c may reduce the risk of tail distortion because the third support element 406c strengthens a section of the suspension tail 300 that corresponds to the bonding area 404. This third support element 406c may be cut off after the HGA assembly process.

Figure 6:
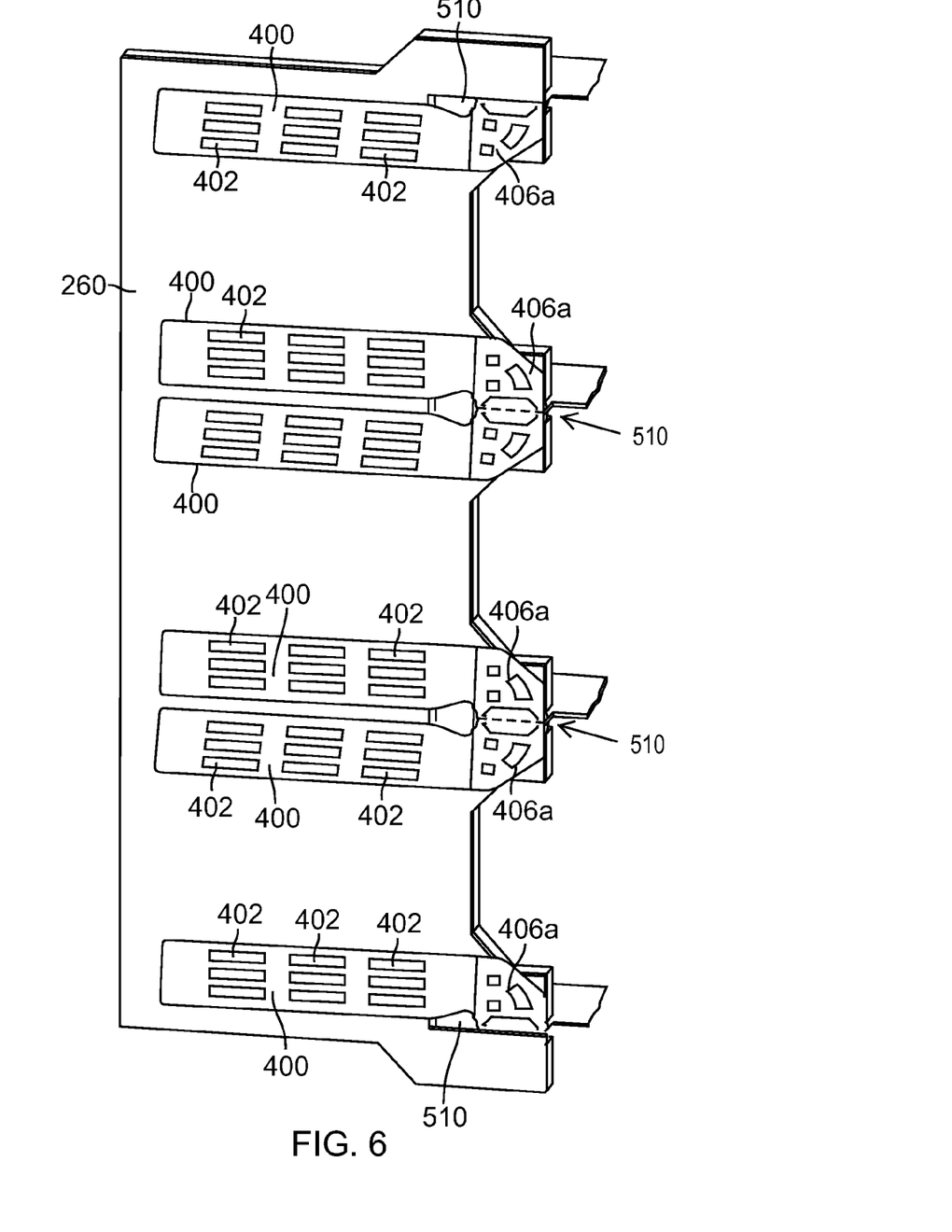
FIG. 6 is a perspective view of a number of improved suspension tails that are electrically connected to a FPC according to an embodiment of the present invention.

FIG. 6 is a perspective view of a number of suspension tails 400 that are electrically connected to a FPC 260 according to an embodiment of the present invention. Now referring to FIG. 6, the FPC 260 includes FPC bond pads (covered by the suspension tails 400) that are aligned with and electrically connected to corresponding bond pads 408 (see FIG. 4) of the suspension tails 400. As shown in FIG. 6, a portion of each of the suspension tails 400 extends into one of the slits 510. In the embodiment of FIG. 6, each of the suspension tails 400 is bent upward or downward near a corresponding slit 510 so that each of the suspension tails 400 is substantially in parallel with the FPC 260 and has the discrete segments 402 facing away from the FPC 260. Because the bonding areas of the suspension tails 400 are clear of other support elements besides the discrete segments 402, a single flat surface of a thermode or other suitable tools may be used to apply pressure and heat to the discrete segments 402 of one or more of the suspension tails 400 simultaneously. As such, no alignment of individual discrete segments 402 is needed. Accordingly, efficiency and reliability of the process and resulting structure may be increased, and manufacturing costs may be reduced.

Figure 7:
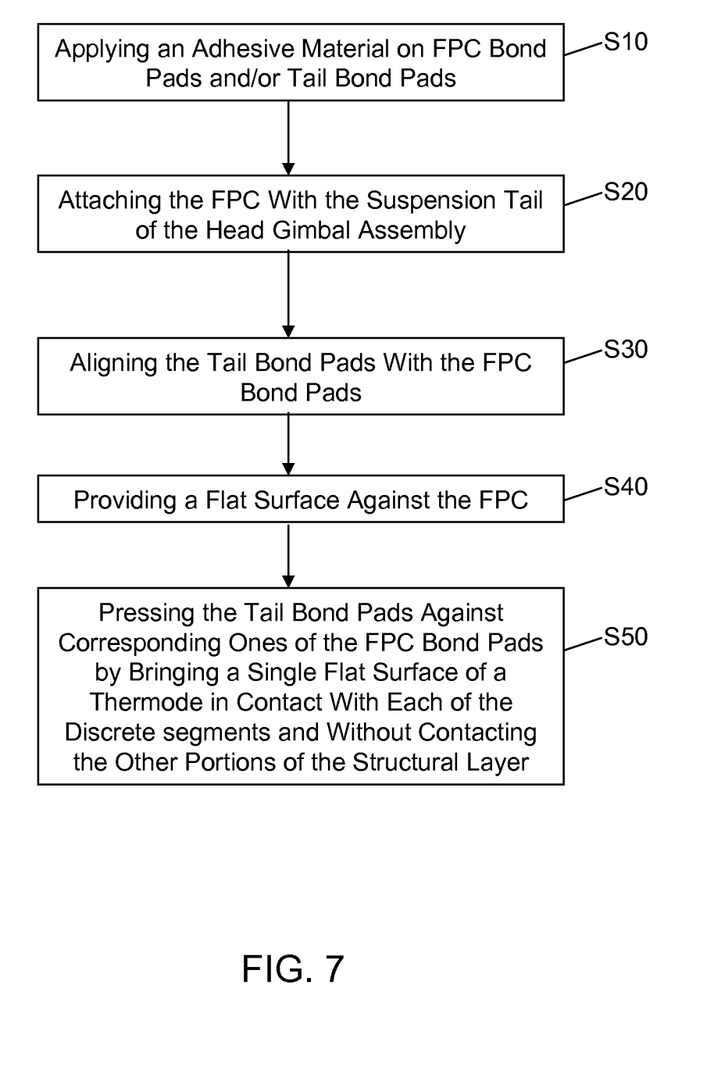
FIG. 7 illustrates a method of assembling a head stack assembly of a disk drive including improved flexure tails for bonding according to an embodiment of the present invention.

FIG. 7 illustrates a method of assembling a head stack assembly of a hard disk drive according to an embodiment of the present invention. It is noted that the following method may not include all the various steps of assembling a head stack assembly because some steps or processes that are generally known in the art and not necessary for the understanding of the present invention may be omitted for clarity.

A flexible printed circuit (FPC) having a number of FPC bond pads is to be attached with a suspension tail of a head gimbal assembly (HGA). The suspension tail includes a dielectric layer, a number of tail bond pads on a first side of the dielectric layer, and a structural layer on a second side of the dielectric layer. The structural layer consists of a number of discrete segments positioned within a bonding area and other portions positioned outside of the bonding area. That is, no other structural elements are located inside the bonding area besides the discrete segments. According to the method, an adhesive material (e.g., an ACF bonding material) is applied on the FPC bond pads and/or the tail bond pads (S10). The discrete segments respectively correspond in position to the bond pads. Then, the FPC is attached with the suspension tail (S20). In several embodiments, process step S20 includes installing the suspension tail of the head gimbal assembly over the adhesive material on the FPC. The tail bond pads are aligned with the FPC bond pads on the FPC (S30). Here, the FPC is placed against a flat surface (S40) that supports the FPC when the suspension tail is pressed against the FPC by a thermode. Then, the tail bond pads are pressed against corresponding ones of the FPC bond pads by bringing a single flat surface of a thermode in contact with each of the discrete segments simultaneously and without contacting the other portions of the structural layer (S50). In several embodiments, process step S50 further includes bringing the single flat surface of the thermode over the suspension tails, and applying force and heat to the thermode to bring conductive particles in the adhesive material in contact with both the tail bond pads and the FPC bond pads and cure the adhesive material to form an electrical bond.

While the above description contains many exemplary embodiments of the present invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A suspension assembly of a head gimbal assembly for a disk drive, comprising:
   a dielectric layer having a first side and a second side opposite the first side;
   a conductive layer on the first side of the dielectric layer, the conductive layer comprising a plurality of bond pads at a tail portion of the suspension assembly; and
   a structural layer on the second side of the dielectric layer, the structural layer consisting of a plurality of discrete segments positioned within a bonding area and other portions positioned outside of the bonding area, the plurality of discrete segments respectively corresponding in position to the bond pads,
   wherein the bonding area extends beyond an area comprising the plurality of discrete segments by a preselected amount, and
   wherein the preselected amount is selected such that the plurality of discrete segments are configured to receive a single flat surface without contacting the other portions of the structural layer.

2. The suspension assembly of claim 1, further comprising a cover layer on the conductive layer, the cover layer having a plurality of openings at locations corresponding to the bond pads.

3. The suspension assembly of claim 1, wherein the dielectric layer has a plurality of openings respectively corresponding to spaces adjacent to the bond pads.

4. The suspension assembly of claim 1, wherein the dielectric layer comprises polyimide.

5. The suspension assembly of claim 1, wherein the conductive layer comprises a plurality of electrically conductive traces connected between the bond pads and a head of the suspension assembly.

6. The suspension assembly of claim 1, wherein the structural layer comprises a stainless steel layer.

7. A disk drive comprising:
   a disk drive base;
   a disk rotatably mounted to the disk drive base;
   an actuator rotatably mounted to the disk drive base, the actuator comprising a flexible printed circuit (FPC) having a plurality of FPC bond pads; and at least one head gimbal assembly operatively attached to the actuator, the at least one head gimbal assembly comprising a suspension assembly that comprises:
- a dielectric layer having a first side and a second side opposite the first side;
- a conductive layer on the first side of the dielectric layer, the conductive layer comprising a plurality of tail bond pads at a tail portion of the suspension assembly, each of the tail bond pads being attached to a corresponding one of the FPC bond pads by a conductive adhesive material; and
- a structural layer on the second side of the dielectric layer, the structural layer comprising a plurality of discrete segments positioned within a bonding area and other portions positioned outside of the bonding area, the plurality of discrete segments respectively corresponding in position to the tail bond pads, wherein the bonding area extends beyond an area comprising the plurality of discrete segments by a preselected amount, and wherein the preselected amount is selected such that the plurality of discrete segments are configured to receive a single flat surface without contacting the other portions of the structural layer.

8. The disk drive of claim 7, wherein the conductive adhesive material comprises an anisotropic conductive film (ACF).

9. The disk drive of claim 7, wherein the dielectric layer has a plurality of openings respectively corresponding to spaces adjacent to the tail bond pads.

10. The disk drive of claim 7, wherein the suspension assembly further comprises a cover layer on the conductive layer, the cover layer having a plurality of openings at locations corresponding to the tail bond pads.

11. The disk drive of claim 7, wherein the structural layer comprises a stainless steel layer.

* * * * *